United States Patent
Song

(10) Patent No.: US 10,622,036 B2
(45) Date of Patent: Apr. 14, 2020

(54) SEMICONDUCTOR SYSTEM

(71) Applicant: SK hynix Inc., Icheon-si, Gyeonggi-do (KR)

(72) Inventor: Keun Soo Song, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/169,746

(22) Filed: Oct. 24, 2018

(65) Prior Publication Data

US 2019/0279692 A1    Sep. 12, 2019

(30) Foreign Application Priority Data

Mar. 9, 2018 (KR) .................... 10-2018-0028179

(51) Int. Cl.
| | |
|---|---|
| *G11C 7/10* | (2006.01) |
| *H04L 7/00* | (2006.01) |
| *G06F 13/16* | (2006.01) |
| *G11C 7/22* | (2006.01) |
| *G11C 29/56* | (2006.01) |

(52) U.S. Cl.
CPC ........ *G11C 7/1066* (2013.01); *G06F 13/1689* (2013.01); *G11C 7/222* (2013.01); *G11C 29/56012* (2013.01); *H04L 7/0008* (2013.01); *H04L 7/0037* (2013.01); *G11C 2207/2254* (2013.01)

(58) Field of Classification Search
CPC ... H04L 7/0008; H04L 7/0016; H04L 7/0025; H04L 7/0029; H04L 7/0033; H04L 7/0037; H04L 7/0041; G06F 13/14; G06F 13/16; G06F 13/1668; G06F 13/1689; G11C 7/10; G11C 7/1051; G11C 7/1066
See application file for complete search history.

(56) References Cited

U.S. PATENT DOCUMENTS

| | | | |
|---|---|---|---|
| 8,723,569 B2 | 5/2014 | Tokuhiro | |
| 9,628,258 B2* | 4/2017 | Im | .......................... H04L 7/0045 |
| 2017/0270982 A1* | 9/2017 | Song | ........................ G11C 7/22 |

FOREIGN PATENT DOCUMENTS

KR    1020150033293 A    4/2015

* cited by examiner

*Primary Examiner* — Lincoln D Donovan
*Assistant Examiner* — Diana J. Cheng
(74) *Attorney, Agent, or Firm* — William Park & Associates Ltd.

(57) ABSTRACT

A semiconductor system includes a first semiconductor device configured to output a clock signal, a strobe signal and mode information signals, and detect a phase difference of the clock signal and the strobe signal depending on a detection signal. The semiconductor system may include a second semiconductor device configured to generate the detection signal by comparing phases of the clock signal and the strobe signal.

22 Claims, 13 Drawing Sheets

SEMICONDUCTOR SYSTEM

CROSS-REFERENCE TO RELATED APPLICATION

The present application claims priority under 35 U.S.C. § 119(a) to Korean Patent Application No. 10-2018-0028179 filed on Mar. 9, 2018 in the Korean Intellectual Property Office, which is incorporated herein by reference in its entirety.

BACKGROUND

1. Technical Field

Embodiments of the present disclosure generally relate to a semiconductor system which detects the phase difference of a clock and a strobe signal.

2. Related Art

A domain crossing margin (tDQSS) between a strobe signal (DQS) and a clock (CLK) is defined in a specification which prescribes the performance of a semiconductor device. Due to this fact, the semiconductor device performs a write leveling operation for calibrating the skew between the strobe signal (DQS) and the clock (CLK), in a write operation.

In general, the write leveling operation is performed by detecting the logic level of the clock (CLK) at the rising edge of the strobe signal (DQS). That is to say, when the write leveling operation is entered, the semiconductor device compares the phases of the strobe signal (DQS) and the clock (CLK) which are inputted thereto and feeds back a comparison result to an external controller, and the external controller adjusts the phase of the strobe signal (DQS) based on the comparison result fed back from the semiconductor device. The background art of the present disclosure is disclosed in U.S. Pat. No. 8,723,569.

SUMMARY

In an embodiment, a semiconductor system may include: a first semiconductor device configured to output a clock signal, a strobe signal and mode information signals, and detect a phase difference of the clock signal and the strobe signal depending on a detection signal. The semiconductor system may include a second semiconductor device configured to set, based on the mode information signals, the strobe signal or the clock signal as a reference for detecting the phase difference of the clock signal and the strobe signal to generate the detection signal.

In an embodiment, a semiconductor system may include: a first semiconductor device configured to output a clock signal, a strobe signal and mode information signals, and detect a phase difference of the clock signal and the strobe signal depending on first to fourth detection signals. The semiconductor system may include a second semiconductor device configured to set, based on the mode information signals, the strobe signal or the clock signal as a reference for detecting the phase difference of the clock signal and the strobe signal to generate the first to fourth detection signals.

In an embodiment, a semiconductor system may include a first semiconductor device configured to output a clock signal, a strobe signal and mode information signals, and detect a phase difference of the clock signal and the strobe signal depending on a detection signal. The semiconductor system may include a second semiconductor device configured to, based on the mode information signals, detect the phase difference of the clock signal and the strobe signal to generate the detection signal and to invert or non-invert, based on the mode information signals, a logic level of the detection signal.

DETAILED DESCRIPTION

Hereinafter, a semiconductor system will be described below with reference to the accompanying drawings through various examples of embodiments.

Various embodiments may be directed to a semiconductor system which performs a write leveling operation by setting a strobe signal or a clock as a reference for detecting the phase difference between the strobe signal and the clock.

According to some embodiments, a write leveling operation may be performed by inverting or non-inverting a result of detecting the phase difference of a clock and a strobe signal. In this regard, various write leveling operations may be performed by performing a write leveling operation through setting the strobe signal or the clock as a reference for detecting the phase difference between the strobe signal and the clock.

Figure 1:
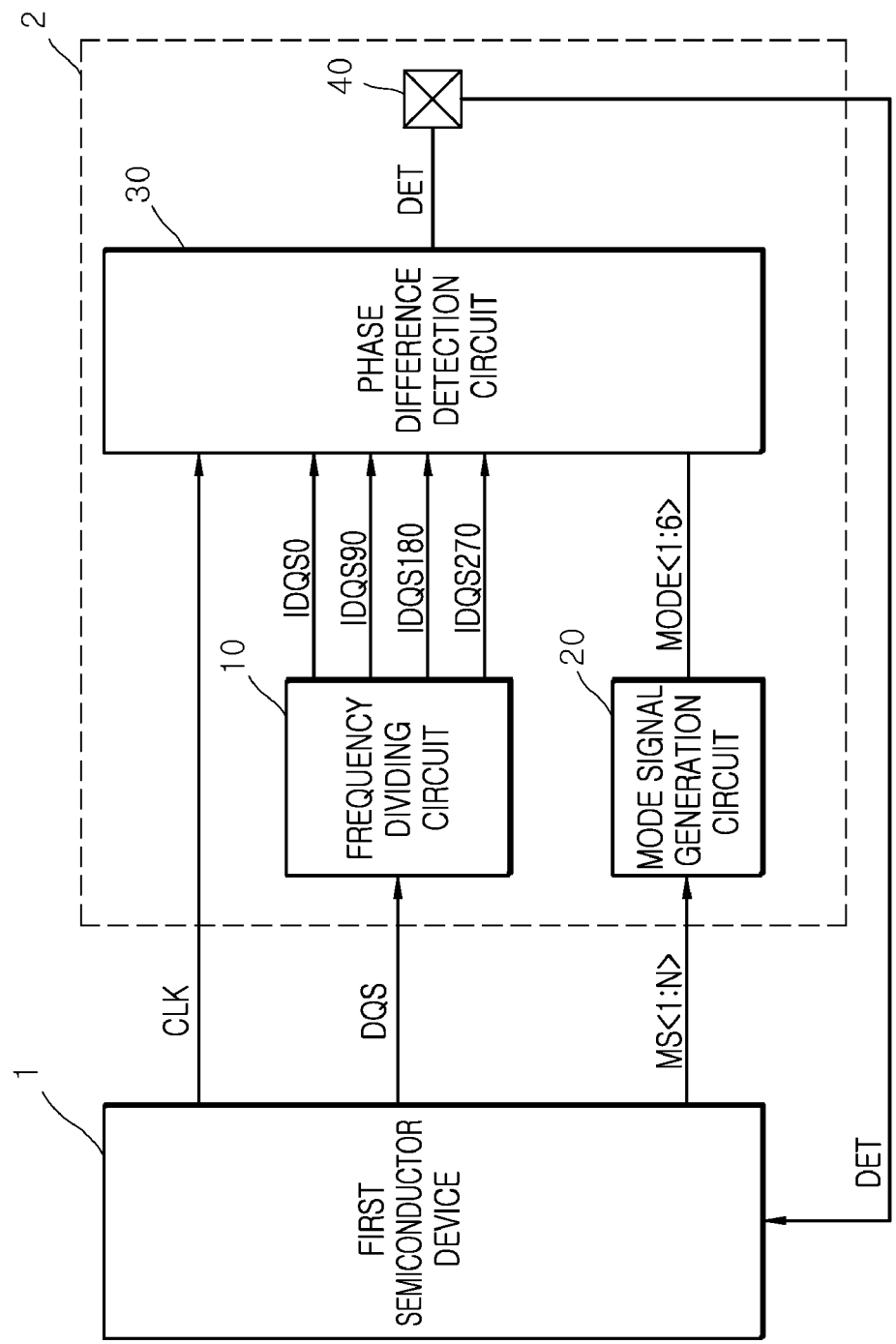
FIG. 1 is a block diagram illustrating a representation of an example of the configuration of a semiconductor system in accordance with an embodiment.

As illustrated in FIG. 1, a semiconductor system in accordance with an embodiment may include a first semiconductor device 1 and a second semiconductor device 2.

The first semiconductor device 1 may output a clock CLK (i.e., clock signal), a strobe signal DQS and mode information signals MS<1:N>. The first semiconductor device 1 may detect the phase difference of the clock CLK and the strobe signal DQS depending on the logic level of a detection signal DET. The first semiconductor device 1 may perform a write leveling operation by detecting the logic level of the detection signal DET. The first semiconductor device 1 may adjust the phase difference of the clock CLK and the strobe signal DQS by detecting the logic level of the detection signal DET. The clock CLK and the strobe signal DQS may be set as signals which toggle cyclically. The mode information signals MS<1:N> may be set as signals for setting first to third modes for generating the detection signal DET. The first mode may be set as a mode for selecting any one of a first internal strobe signal IDQS0, a second internal strobe signal IDQS90, a third internal strobe signal IDQS180 and a fourth internal strobe signal IDQS270, as a strobe signal for comparing the phases of the clock CLK and the strobe signal DQS. The second mode may be set as a mode for determining whether to invert the logic level of the detection signal DET. The third mode may be set as a mode for determining whether the detection signal DET is to be generated from the strobe signal DQS in synchronization with the edge of the clock CLK or to be generated from the clock CLK in synchronization with the edge of the strobe signal DQS.

The second semiconductor device 2 may include a frequency dividing circuit 10, a mode signal generation circuit 20, a phase difference detection circuit 30 and a pad 40.

The frequency dividing circuit 10 may divide the frequency of the strobe signal DQS and thereby generate the first internal strobe signal IDQS0, the second internal strobe signal IDQS90, the third internal strobe signal IDQS180 and the fourth internal strobe signal IDQS270. The first internal strobe signal IDQS0, the second internal strobe signal IDQS90, the third internal strobe signal IDQS180 and the fourth internal strobe signal IDQS270 may be generated to have phase differences of 90°. The second internal strobe signal IDQS90 may be generated to have a phase 90° later than the first internal strobe signal IDQS0. The third internal strobe signal IDQS180 may be generated to have a phase 90° later than the second internal strobe signal IDQS90. The fourth internal strobe signal IDQS270 may be generated to have a phase 90° later than the third internal strobe signal IDQS180.

The mode signal generation circuit 20 may decode the mode information signals MS<1:N> and thereby generate mode signals MODE<1:6>. The mode signals MODE<1:4> of the mode signals MODE<1:6> may be set as first mode signals for setting the first mode. The mode signal MODE<5> of the mode signals MODE<1:6> may be set as a second mode signal for setting the second mode. The mode signal MODE<6> of the mode signals MODE<1:6> may be set as a third mode signal for setting the third mode. While the mode signals MODE<1:6> are set to be generated from the mode information signals MS<1:N> inputted from the first semiconductor device 1, it is to be noted that the mode signals MODE<1:6> may be set by a mode register set (MRS).

The phase difference detection circuit 30 may compare the phase of the clock CLK and the phase of any one of the first internal strobe signal IDQS0, the second internal strobe signal IDQS90, the third internal strobe signal IDQS180 and the fourth internal strobe signal IDQS270 in response to the mode signals MODE<1:6>, and thereby generate the detection signal DET.

The pad 40 may be embodied by a general pad which receives the detection signal DET and outputs the detection signal DET to an exterior.

The second semiconductor device 2 according to an embodiment, configured as mentioned above, may compare the phase of the clock CLK and the phase of the strobe signal DQS in response to the mode information signals MS<1:N> and thereby generate the detection signal DET. The second semiconductor device 2 may invert or non-invert the detection signal DET being a result of detecting the difference between the phase of the clock CLK and the phase of the strobe signal DQS, depending on the mode information signals MS<1:N>. The second semiconductor device 2 may set the strobe signal DQS or the clock CLK as a reference for detecting the difference between the phase of the clock CLK and the phase of the strobe signal DQS, depending on the mode information signals MS<1:N>.

Figure 2:
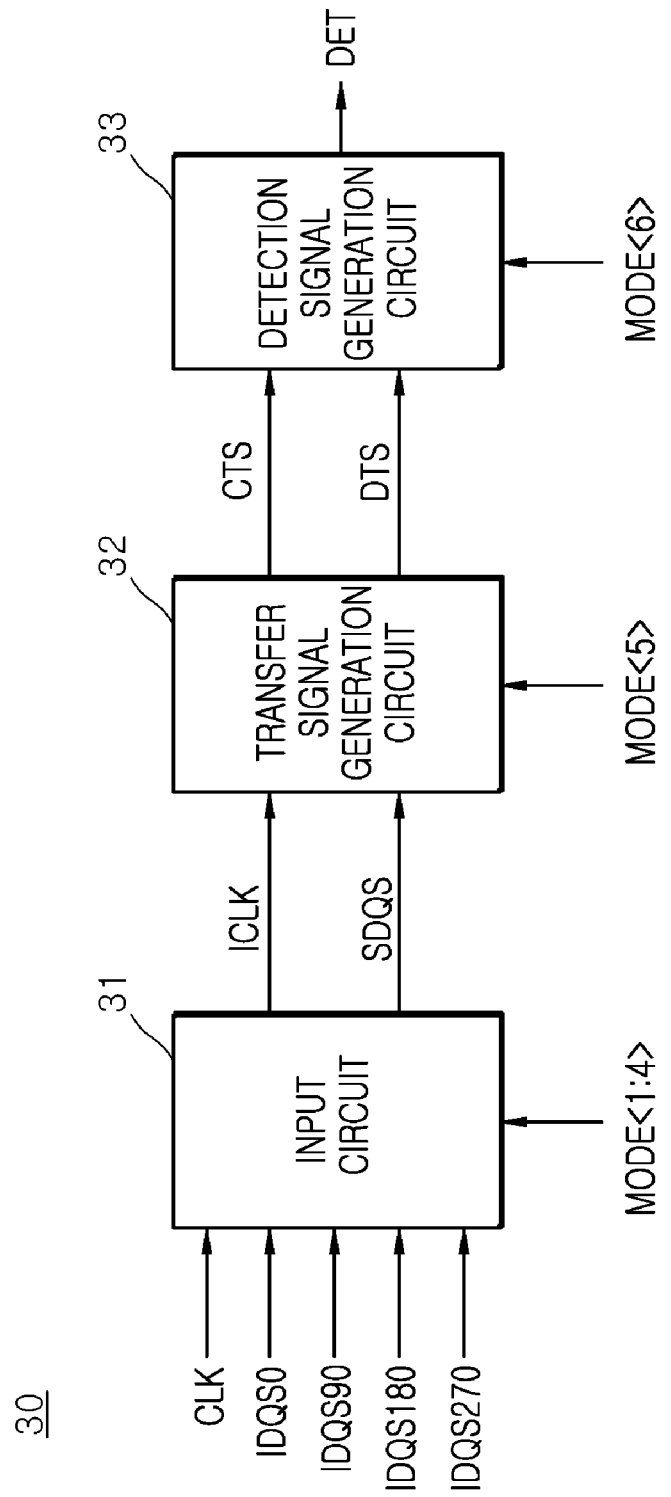
FIG. 2 is a block diagram illustrating a representation of an example of the configuration of the phase difference detection circuit included in a semiconductor device illustrated in FIG. 1.

Referring to FIG. 2, the phase difference detection circuit 30 may include an input circuit 31, a transfer signal generation circuit 32 and a detection signal generation circuit 33.

The input circuit 31 may buffer the clock CLK and thereby generate an internal clock ICLK (i.e., internal clock signal). The input circuit 31 may output any one of the first internal strobe signal IDQS0, the second internal strobe signal IDQS90, the third internal strobe signal IDQS180 and the fourth internal strobe signal IDQS270, as a selected strobe signal SDQS, in response to the first mode signals MODE<1:4>.

The transfer signal generation circuit 32 may output the internal clock ICLK as a clock transfer signal CTS in synchronization with the edge of the selected strobe signal SDQS in response to the second mode signal MODE<5>. The transfer signal generation circuit 32 may output the selected strobe signal SDQS as a strobe transfer signal DTS in synchronization with the edge of the internal clock ICLK in response to the second mode signal MODE<5>.

The detection signal generation circuit 33 may output any one of the clock transfer signal CTS and the strobe transfer signal DTS as the detection signal DET in response to the third mode signal MODE<6>. The detection signal generation circuit 33 may output the clock transfer signal CTS as the detection signal DET in the case where the third mode signal MODE<6> is a first logic level (i.e., a logic low level). The detection signal generation circuit 33 may output the strobe transfer signal DTS as the detection signal DET in the case where the third mode signal MODE<6> is a second logic level (i.e., a logic high level).

Figure 3:
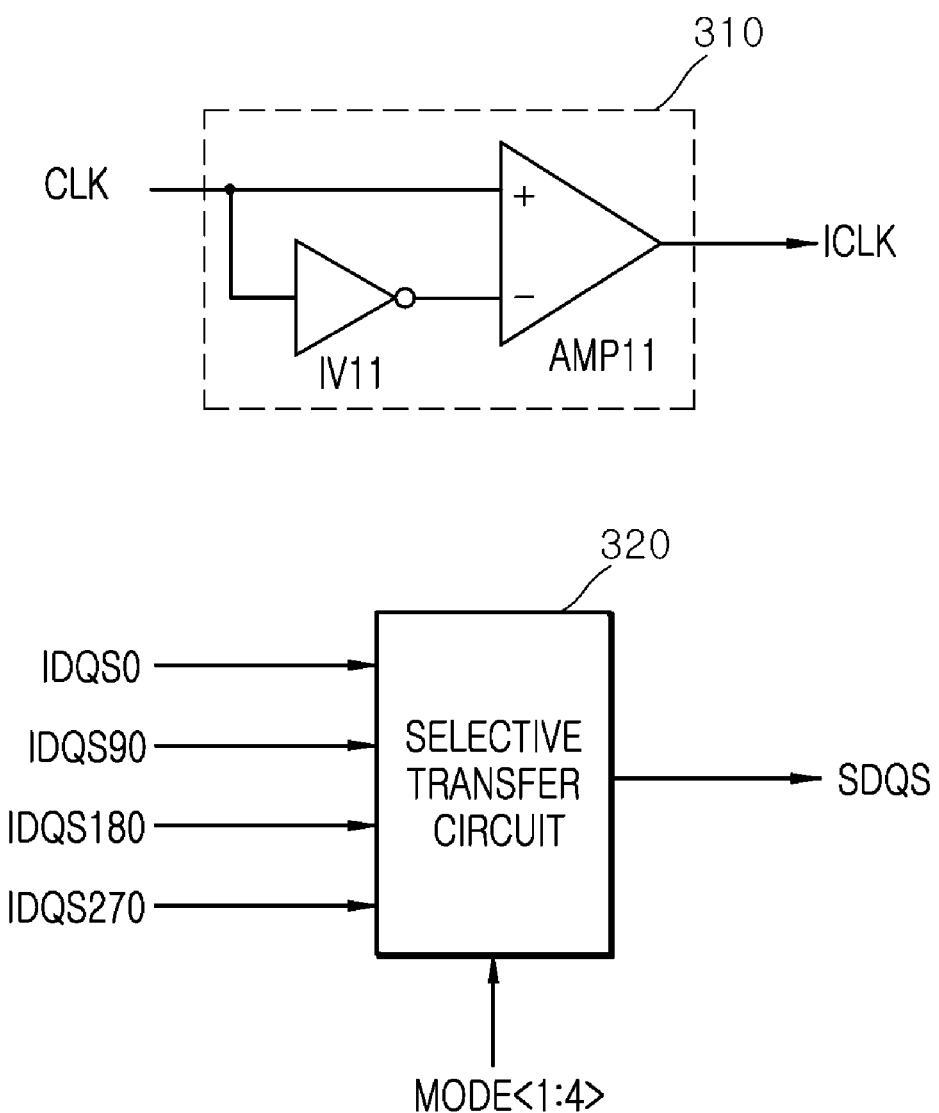
FIG. 3 is a diagram illustrating a representation of an example of the configuration of the input circuit included in the phase difference detection circuit illustrated in FIG. 2.

Referring to FIG. 3, the input circuit 31 may include an internal clock generation circuit 310 and a selective transfer circuit 320.

The internal clock generation circuit 310 may include an inverter IV11 and a comparator AMP11. The internal clock generation circuit 310 may compare the clock CLK and the inverted signal of the clock CLK and thereby generate the internal clock ICLK. The internal clock generation circuit 310 may buffer the clock CLK and thereby generate the internal clock ICLK.

The selective transfer circuit 320 may output any one of the first internal strobe signal IDQS0, the second internal strobe signal IDQS90, the third internal strobe signal IDQS180 and the fourth internal strobe signal IDQS270, as the selected strobe signal SDQS, in response to the first mode signals MODE<1:4>. The selective transfer circuit 320 may output the first internal strobe signal IDQS0 as the selected strobe signal SDQS in the case where the mode signal MODE<1> is a second logic level (i.e., a logic high level). The selective transfer circuit 320 may output the second internal strobe signal IDQS90 as the selected strobe signal SDQS in the case where the mode signal MODE<2> is a second logic level (i.e., a logic high level). The selective transfer circuit 320 may output the third internal strobe signal IDQS180 as the selected strobe signal SDQS in the case where the mode signal MODE<3> is a second logic level (i.e., a logic high level). The selective transfer circuit 320 may output the fourth internal strobe signal IDQS270 as the selected strobe signal SDQS in the case where the mode signal MODE<4> is a second logic level (i.e., a logic high level).

Figure 4:
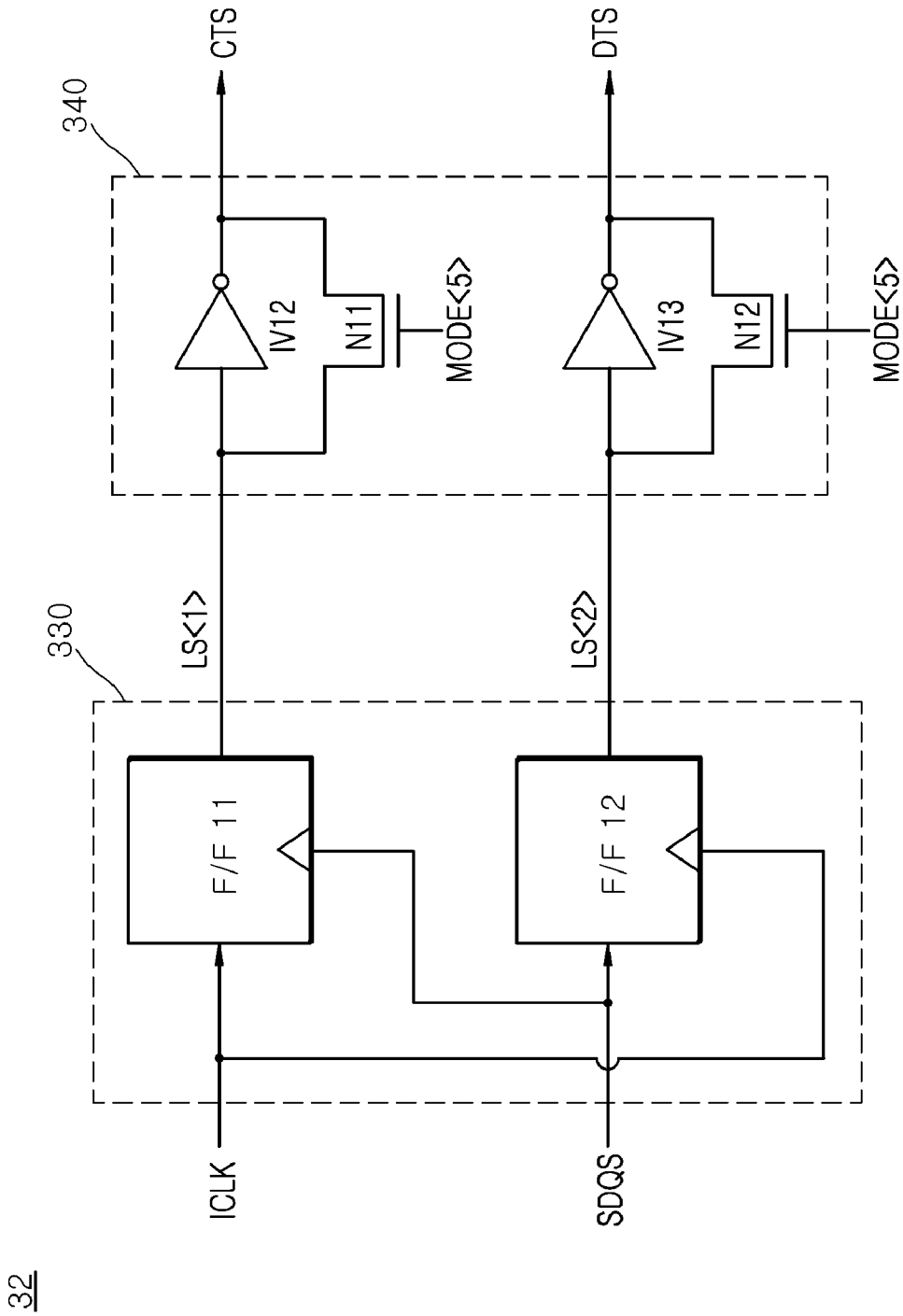
FIG. 4 is a circuit diagram illustrating a representation of an example of the configuration of the transfer signal generation circuit included in the phase difference detection circuit illustrated in FIG. 2.

Referring to FIG. 4, the transfer signal generation circuit 32 may include a latch circuit 330 and a transfer circuit 340.

The latch circuit 330 may include flip-flops F/F11 and F/F12. The latch circuit 330 may latch the internal clock ICLK in synchronization with the rising edge of the selected strobe signal SDQS and thereby generate a first latch signal LS<1>. The latch circuit 330 may latch the selected strobe signal SDQS in synchronization with the rising edge of the internal clock ICLK and thereby generate a second latch signal LS<2>.

The transfer circuit 340 may include inverters IV12 and IV13 and NMOS transistors N11 and N12. The transfer circuit 340 may invert or non-invert the first latch signal LS<1> in response to the second mode signal MODE<5> and thereby output the clock transfer signal CTS. The transfer circuit 340 may invert the first latch signal LS<1> in the case where the second mode signal MODE<5> is a first logic level (i.e., a logic low level) and thereby output the clock transfer signal CTS. The transfer circuit 340 may non-invert the first latch signal LS<1> in the case where the second mode signal MODE<5> is a second logic level (i.e., a logic high level) and thereby output the clock transfer signal CTS. The transfer circuit 340 may invert or non-invert the second latch signal LS<2> in response to the second mode signal MODE<5> and thereby output the strobe transfer signal DTS. The transfer circuit 340 may invert the second latch signal LS<2> in the case where the second mode signal MODE<5> is the first logic level (i.e., the logic low level) and thereby output the strobe transfer signal DTS. The transfer circuit 340 may non-invert the second latch signal LS<2> in the case where the second mode signal MODE<5> is the second logic level (i.e., the logic high level) and thereby output the strobe transfer signal DTS.

Figure 5:
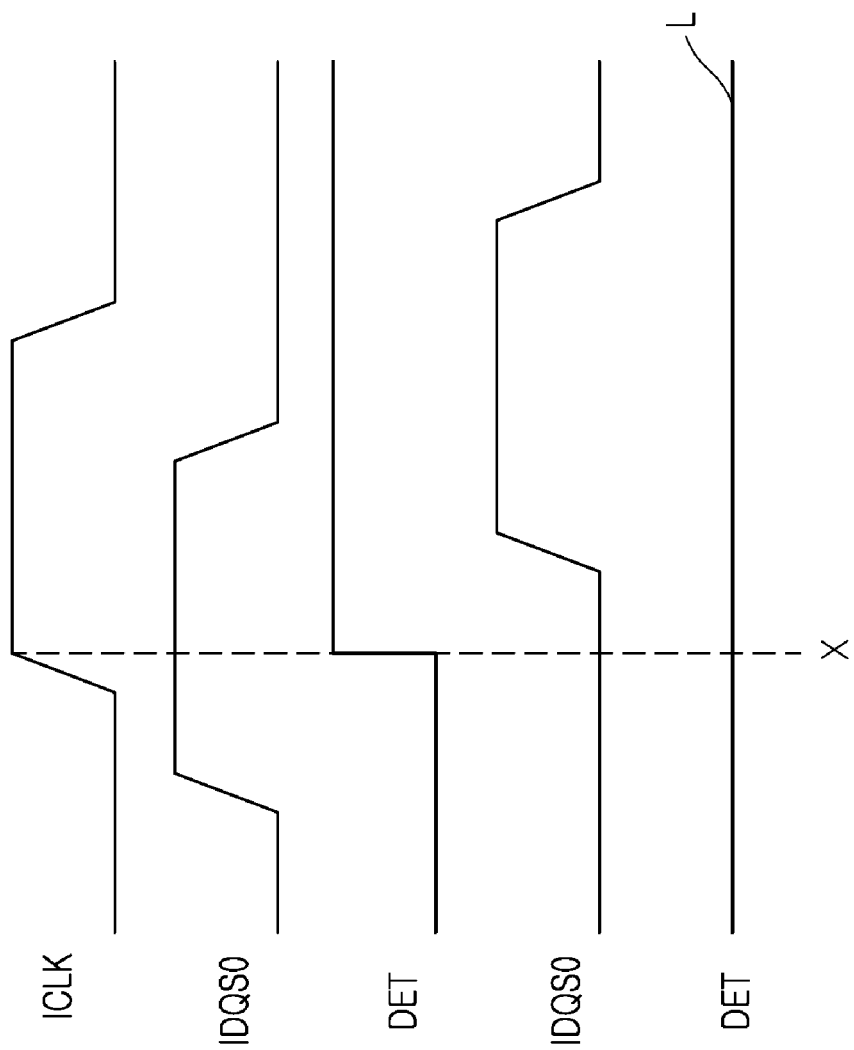
FIGS. 5 and 6 are representations of examples of timing diagrams to assist in the explanation of the operations of the semiconductor system in accordance with an embodiment.

An operation of generating the detection signal DET depending on the difference between the phase of the clock CLK and the phase of the strobe signal DQS will be described below as an example with reference to FIG. 5, by taking an example in which the first internal strobe signal IDQS0 is selected in the first mode, the detection signal DET is generated through non-inversion in the second mode and the detection signal DET is generated from the strobe signal DQS in synchronization with the edge of the clock CLK in the third mode.

In the case where the first internal strobe signal IDQS0 is a second logic level (a logic high level) at a time X corresponding to the rising edge of the internal clock ICLK, the detection signal DET is generated at the second logic level (the logic high level). As a case where the detection signal DET is the second logic level (the logic high level) is set as a case where the phase of the strobe signal DQS is earlier than the phase of the clock CLK, the first semiconductor device 1 adjusts the phase of the strobe signal DQS to be late.

In the case where the first internal strobe signal IDQS0 is a first logic level (a logic low level) at a time X corresponding to the rising edge of the internal clock ICLK, the detection signal DET is generated at the first logic level (the logic low level). As a case where the detection signal DET is the first logic level (the logic low level) is set as a case where the phase of the strobe signal DQS is later than the phase of the clock CLK, the first semiconductor device 1 adjusts the phase of the strobe signal DQS to be early.

Figure 6:
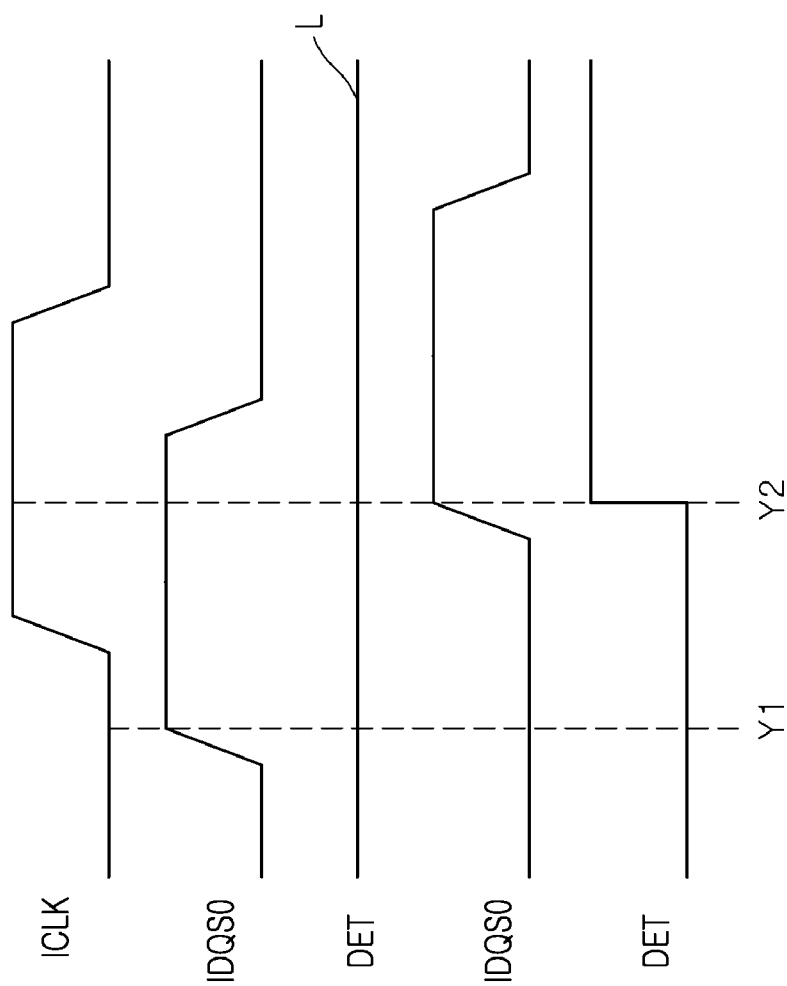

An operation of generating the detection signal DET depending on the difference between the phase of the clock CLK and the phase of the strobe signal DQS will be described below as an example with reference to FIG. 6, by taking an example in which the first internal strobe signal IDQS0 is selected in the first mode, the detection signal DET is generated through non-inversion in the second mode and the detection signal DET is generated from the clock CLK in synchronization with the edge of the strobe signal DQS in the third mode.

In the case where the internal clock ICLK is the first logic level (the logic low level) at a time Y1 corresponding to the rising edge of the first internal strobe signal IDQS0, the detection signal DET is generated at the first logic level (the logic low level (L)). As a case where the detection signal DET is the first logic level (the logic low level) is set as a case where the phase of the strobe signal DQS is earlier than the phase of the clock CLK, the first semiconductor device 1 adjusts the phase of the strobe signal DQS to be late.

In the case where the internal clock ICLK is the second logic level (the logic high level) at a time Y2 corresponding to the rising edge of the first internal strobe signal IDQS0, the detection signal DET is generated at the second logic level (the logic high level). As a case where the detection signal DET is the second logic level (the logic high level) is set as a case where the phase of the strobe signal DQS is later than the phase of the clock CLK, the first semiconductor device 1 adjusts the phase of the strobe signal DQS to be early.

As is apparent from the above descriptions, the semiconductor system in accordance with an embodiment may perform a write leveling operation by inverting or non-inverting a result of detecting the difference between the phase of a clock and the phase of a strobe signal. Also, the semiconductor system in accordance with the embodiment may perform the write leveling operation by setting the strobe signal or the clock as a reference for detecting the phase difference between the strobe signal and the clock.

Figure 7:
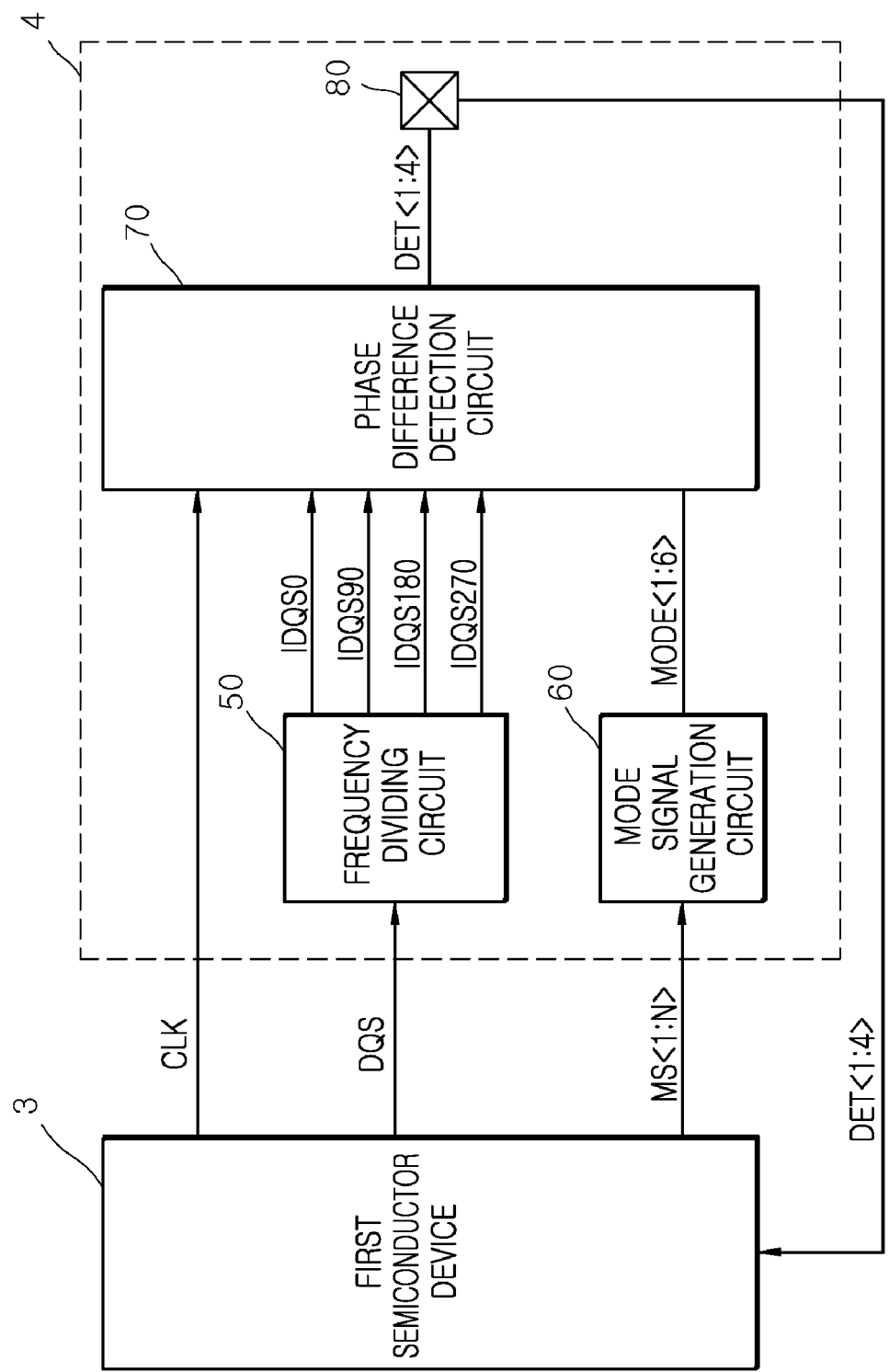
FIG. 7 is a block diagram illustrating a representation of an example of the configuration of a semiconductor system in accordance with other embodiments.

Referring to FIG. 7, a semiconductor system in accordance with other embodiments may include a first semiconductor device 3 and a second semiconductor device 4.

The first semiconductor device 3 may output a clock CLK, a strobe signal DQS and mode information signals MS<1:N>. The first semiconductor device 3 may detect the phase difference of the clock CLK and the strobe signal DQS depending on the logic level combination of first to fourth detection signals DET<1:4>. The first semiconductor device 3 may perform a write leveling operation by detecting the logic levels of the first to fourth detection signals DET<1:4>. The first semiconductor device 3 may adjust the phase difference of the clock CLK and the strobe signal DQS by detecting the logic level combination of the first to fourth detection signals DET<1:4>. The clock CLK and the strobe signal DQS may be set as signals which toggle cyclically. A case where the count of second logic levels (i.e., logic high levels) of the first to fourth detection signals DET<1:4> is less than a predetermined count may be set as a case where the phase of the strobe signal DQS is earlier than the phase of the clock CLK. A case where the count of second logic levels (i.e., logic high levels) of the first to fourth detection signals DET<1:4> is greater than the predetermined count may be set as a case where the phase of the strobe signal DQS is later than the phase of the clock CLK. The logic level combination of the first to fourth detection signals DET<1:4>, which includes information on the phase difference of the clock CLK and the strobe signal DQS, may be set oppositely according to an embodiment. The mode information signals MS<1:N> may be set as signals for setting first to third modes for generating the first to fourth detection signals DET<1:4>. The first mode may be set as a mode for selecting any one of a first internal strobe signal IDQS0, a second internal strobe signal IDQS90, a third internal strobe signal IDQS180 and a fourth internal strobe signal IDQS270, as a strobe signal for comparing the phases of the clock CLK and the strobe signal DQS. The second mode is a mode for determining whether to invert the logic levels of the first to fourth detection signals DET<1:4>. The third mode may be set as a mode for determining whether the first to fourth detection signals DET<1:4> are to be generated from the strobe signal DQS in synchronization with the edge of the clock CLK or to be generated from the clock CLK in synchronization with the edge of the strobe signal DQS.

The second semiconductor device 4 may include a frequency dividing circuit 50, a mode signal generation circuit 60, a phase difference detection circuit 70 and a pad 80.

The frequency dividing circuit 50 may divide the frequency of the strobe signal DQS and thereby generate the first internal strobe signal IDQS0, the second internal strobe signal IDQS90, the third internal strobe signal IDQS180 and the fourth internal strobe signal IDQS270. The first internal strobe signal IDQS0, the second internal strobe signal IDQS90, the third internal strobe signal IDQS180 and the fourth internal strobe signal IDQS270 may be generated to have phase differences of 90°. The second internal strobe signal IDQS90 may be generated to have a phase 90° later than the first internal strobe signal IDQS0. The third internal strobe signal IDQS180 may be generated to have a phase 90° later than the second internal strobe signal IDQS90. The fourth internal strobe signal IDQS270 may be generated to have a phase 90° later than the third internal strobe signal IDQS180.

The mode signal generation circuit 60 may decode the mode information signals MS<1:N> and thereby generate mode signals MODE<1:6>. The mode signals MODE<1:4> of the mode signals MODE<1:6> may be set as first mode signals for setting the first mode. The mode signal MODE<5> of the mode signals MODE<1:6> may be set as a second mode signal for setting the second mode. The mode signal MODE<6> of the mode signals MODE<1:6> may be set as a third mode signal for setting the third mode. While the mode signals MODE<1:6> are set to be generated from the mode information signals MS<1:N> inputted from the first semiconductor device 3, it is to be noted that the mode signals MODE<1:6> may be set by a mode register set (MRS).

The phase difference detection circuit 70 may compare the phase of the clock CLK and the phase of any one of the first internal strobe signal IDQS0, the second internal strobe signal IDQS90, the third internal strobe signal IDQS180 and the fourth internal strobe signal IDQS270 in response to the mode signals MODE<1:6>, and thereby generate the first to fourth detection signals DET<1:4>.

The pad 80 may be embodied by a general pad which receives the first to fourth detection signals DET<1:4> and outputs the first to fourth detection signals DET<1:4> to an exterior.

The second semiconductor device 4 according to an embodiment, configured as mentioned above, may compare the phase of the clock CLK and the phase of the strobe signal DQS in response to the mode information signals MS<1:N> and thereby generate the first to fourth detection signals DET<1:4>. The second semiconductor device 4 may output the first to fourth detection signals DET<1:4> by inverting or non-inverting the logic levels thereof depending on the mode information signals MS<1:N>. The second semiconductor device 4 may set the strobe signal DQS or the clock CLK as a reference for detecting the difference between the phase of the clock CLK and the phase of the strobe signal DQS, depending on the mode information signals MS<1:N>.

Figure 8:
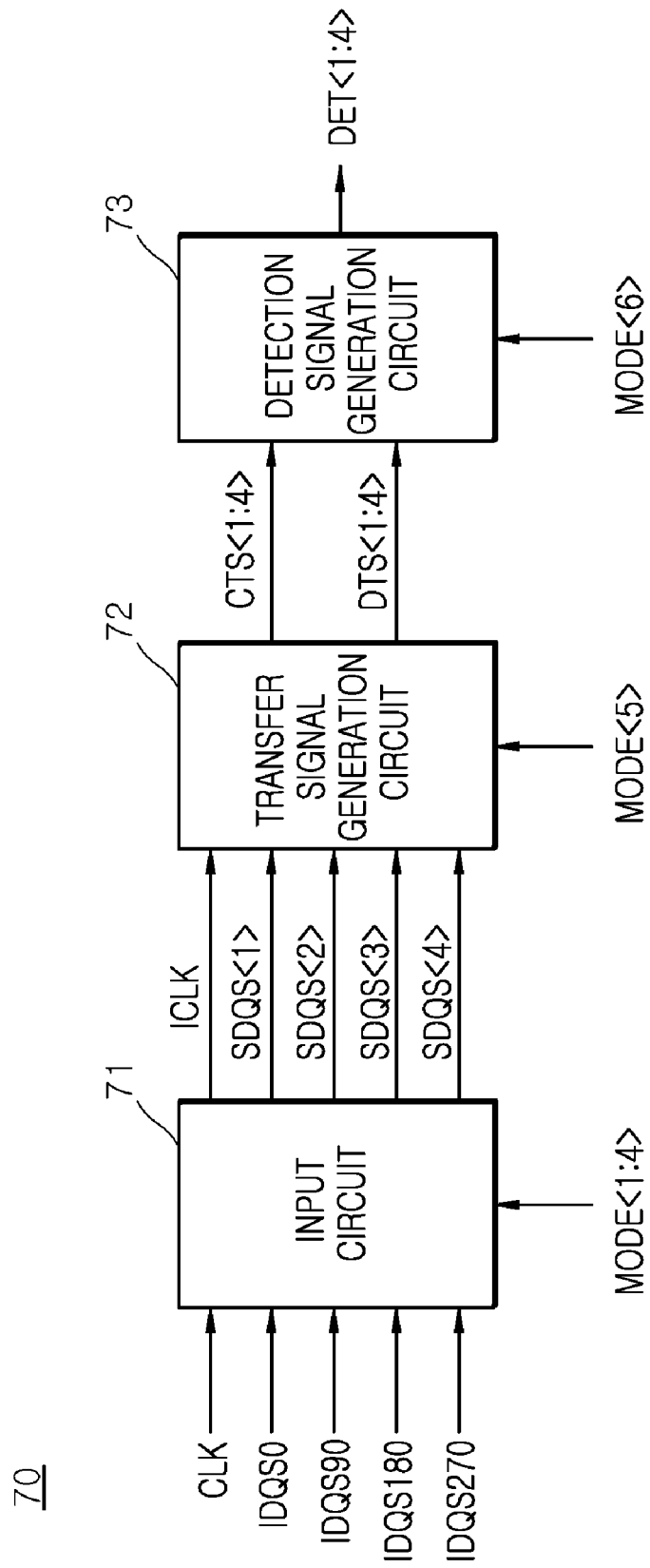
FIG. 8 is a block diagram illustrating a representation of an example of the configuration of the phase difference detection circuit included in a semiconductor device illustrated in FIG. 7.

Referring to FIG. 8, the phase difference detection circuit 70 may include an input circuit 71, a transfer signal generation circuit 72 and a detection signal generation circuit 73.

The input circuit 71 may buffer the clock CLK and thereby generate an internal clock ICLK. The input circuit 71 may successively delay any one of the first internal strobe signal IDQS0, the second internal strobe signal IDQS90, the third internal strobe signal IDQS180 and the fourth internal strobe signal IDQS270 in response to the first mode signals MODE<1:4>, and thereby generate a first selected strobe signal SDQS<1>, a second selected strobe signal SDQS<2>, a third selected strobe signal SDQS<3> and a fourth selected strobe signal SDQS<4>.

The transfer signal generation circuit 72 may output the internal clock ICLK as a first clock transfer signal CTS<1>, a second clock transfer signal CTS<2>, a third clock transfer signal CTS<3> and a fourth clock transfer signal CTS<4> in synchronization with the edges of the first selected strobe signal SDQS<1>, the second selected strobe signal SDQS<2>, the third selected strobe signal SDQS<3> and the fourth selected strobe signal SDQS<4> in response to the second mode signal MODE<5>. The transfer signal generation circuit 72 may output the first selected strobe signal SDQS<1>, the second selected strobe signal SDQS<2>, the third selected strobe signal SDQS<3> and the fourth selected strobe signal SDQS<4> as a first strobe transfer signal DTS<1>, a second strobe transfer signal DTS<2>, a third strobe transfer signal DTS<3> and a fourth strobe transfer signal DTS<4> in synchronization with the edges of the internal clock ICLK in response to the second mode signal MODE<5>.

The detection signal generation circuit 73 may output the first clock transfer signal CTS<1>, the second clock transfer signal CTS<2>, the third clock transfer signal CTS<3> and the fourth clock transfer signal CTS<4> or the first strobe transfer signal DTS<1>, the second strobe transfer signal DTS<2>, the third strobe transfer signal DTS<3> and the fourth strobe transfer signal DTS<4> as the first detection signal DET<1>, the second detection signal DET<2>, the third detection signal DET<3> and the fourth detection signal DET<4> in response to the third mode signal MODE<6>. The detection signal generation circuit 73 may output the first clock transfer signal CTS<1>, the second clock transfer signal CTS<2>, the third clock transfer signal CTS<3> and the fourth clock transfer signal CTS<4> as the first detection signal DET<1>, the second detection signal DET<2>, the third detection signal DET<3> and the fourth detection signal DET<4> in the case where the third mode signal MODE<6> is a first logic level (i.e., a logic low level). The detection signal generation circuit 73 may output the first strobe transfer signal DTS<1>, the second strobe transfer signal DTS<2>, the third strobe transfer signal DTS<3> and the fourth strobe transfer signal DTS<4> as the first detection signal DET<1>, the second detection signal DET<2>, the third detection signal DET<3> and the fourth detection signal DET<4> in the case where the third mode signal MODE<6> is a second logic level (i.e., a logic high level).

Figure 9:
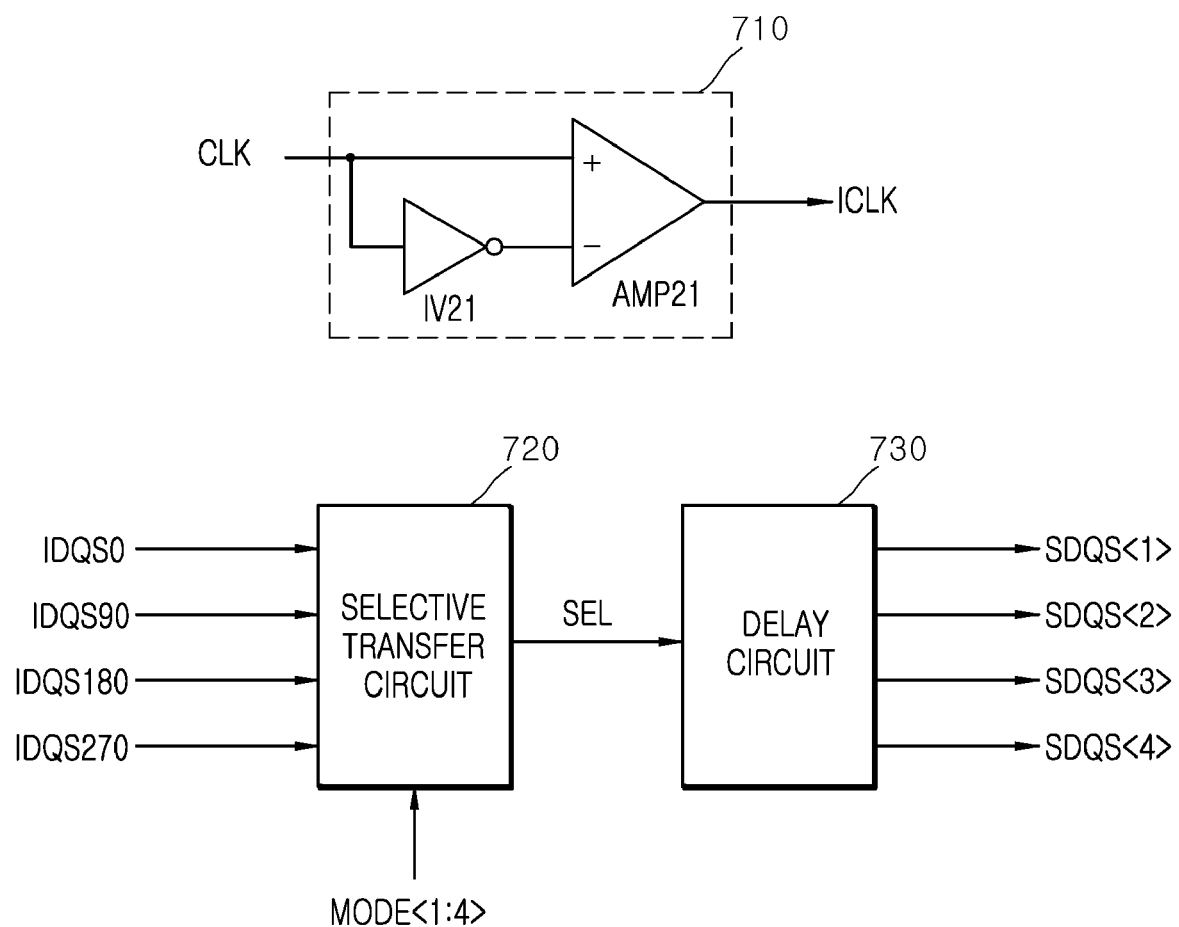
FIG. 9 is a diagram illustrating a representation of an example of the configuration of the input circuit included in the phase difference detection circuit illustrated in FIG. 8.

Referring to FIG. 9, the input circuit 71 may include an internal clock generation circuit 710, a selective transfer circuit 720 and a delay circuit 730.

The internal clock generation circuit 710 may include an inverter IV21 and a comparator AMP21. The internal clock generation circuit 710 may compare the clock CLK and the inverted signal of the clock CLK and thereby generate the internal clock ICLK. The internal clock generation circuit 710 may buffer the clock CLK and thereby generate the internal clock ICLK.

The selective transfer circuit 720 may output any one of the first internal strobe signal IDQS0, the second internal strobe signal IDQS90, the third internal strobe signal IDQS180 and the fourth internal strobe signal IDQS270, as a selection signal SEL, in response to the first mode signals MODE<1:4>. The selective transfer circuit 720 may output the first internal strobe signal IDQS0 as the selection signal SEL in the case where the mode signal MODE<1> is a second logic level (i.e., a logic high level). The selective transfer circuit 720 may output the second internal strobe signal IDQS90 as the selection signal SEL in the case where the mode signal MODE<2> is a second logic level (i.e., a logic high level). The selective transfer circuit 720 may output the third internal strobe signal IDQS180 as the selection signal SEL in the case where the mode signal MODE<3> is a second logic level (i.e., a logic high level). The selective transfer circuit 720 may output the fourth internal strobe signal IDQS270 as the selection signal SEL in the case where the mode signal MODE<4> is a second logic level (i.e., a logic high level).

The delay circuit 730 may successively delay the selection signal SEL and thereby generate the first selected strobe signal SDQS<1>, the second selected strobe signal SDQS<2>, the third selected strobe signal SDQS<3> and the fourth selected strobe signal SDQS<4>. The delay circuit 730 may delay the selection signal SEL and thereby generate the first selected strobe signal SDQS<1>. The delay circuit 730 may delay the first selected strobe signal SDQS<1> and thereby generate the second selected strobe signal SDQS<2>. The delay circuit 730 may delay the second selected strobe signal SDQS<2> and thereby generate the third selected strobe signal SDQS<3>. The delay circuit 730 may delay the third selected strobe signal SDQS<3> and thereby generate the fourth selected strobe signal SDQS<4>.

Figure 10:
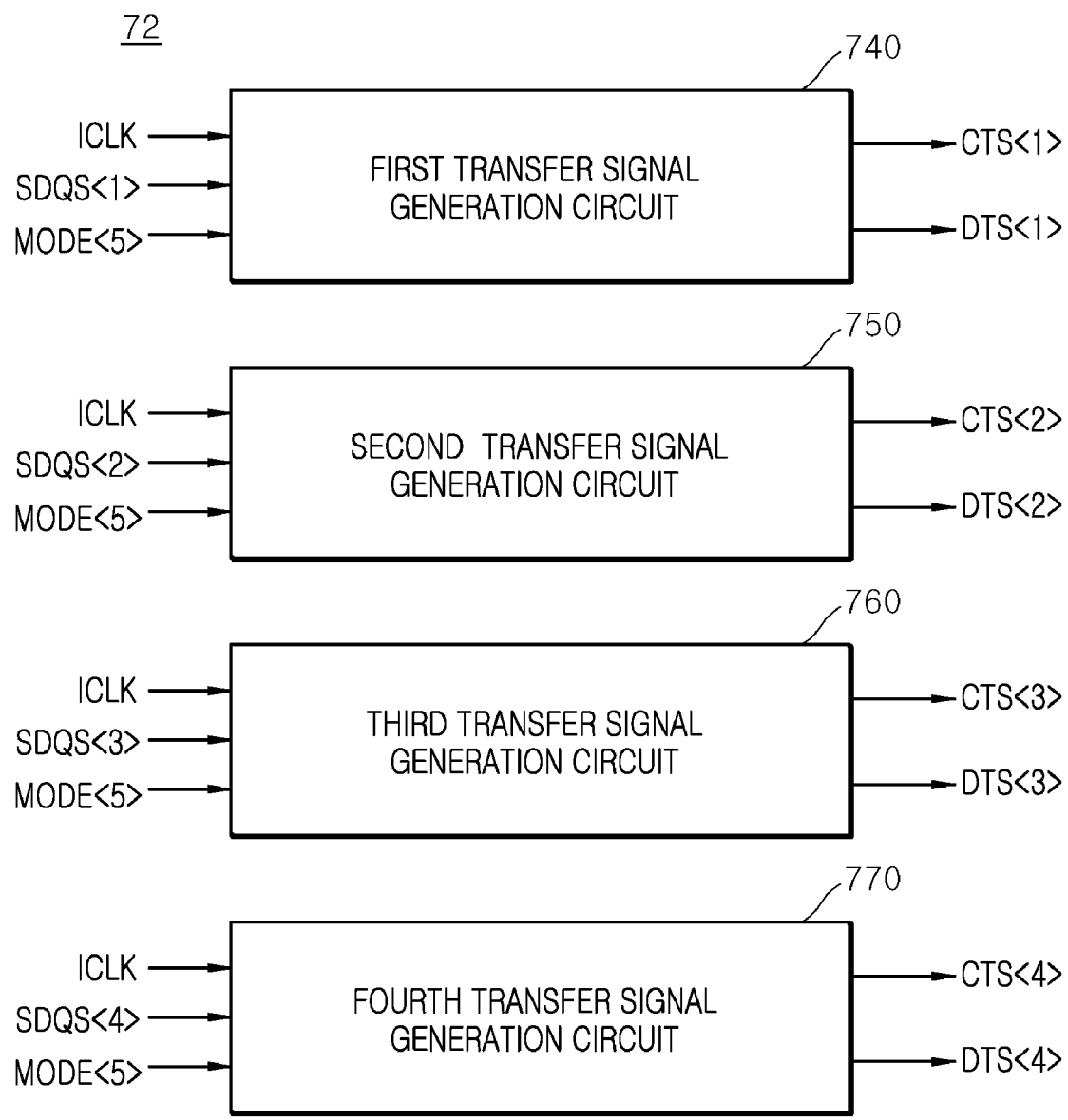
FIG. 10 is a block diagram illustrating a representation of an example of the configuration of the transfer signal generation circuit included in the phase difference detection circuit illustrated in FIG. 8.

Referring to FIG. 10, the transfer signal generation circuit 72 may include a first transfer signal generation circuit 740, a second transfer signal generation circuit 750, a third transfer signal generation circuit 760 and a fourth transfer signal generation circuit 770.

The first transfer signal generation circuit 740 may output the internal clock ICLK as the first clock transfer signal CTS<1> in synchronization with the edge of the first selected strobe signal SDQS<1> in response to the second mode signal MODE<5>. The first transfer signal generation circuit 740 may output the first selected strobe signal SDQS<1> as the first strobe transfer signal DTS<1> in synchronization with the edge of the internal clock ICLK in response to the second mode signal MODE<5>.

The second transfer signal generation circuit 750 may output the internal clock ICLK as the second clock transfer signal CTS<2> in synchronization with the edge of the second selected strobe signal SDQS<2> in response to the second mode signal MODE<5>. The second transfer signal generation circuit 750 may output the second selected strobe signal SDQS<2> as the second strobe transfer signal DTS<2> in synchronization with the edge of the internal clock ICLK in response to the second mode signal MODE<5>.

The third transfer signal generation circuit 760 may output the internal clock ICLK as the third clock transfer signal CTS<3> in synchronization with the edge of the third selected strobe signal SDQS<3> in response to the second mode signal MODE<5>. The third transfer signal generation circuit 760 may output the third selected strobe signal SDQS<3> as the third strobe transfer signal DTS<3> in synchronization with the edge of the internal clock ICLK in response to the second mode signal MODE<5>.

The fourth transfer signal generation circuit 770 may output the internal clock ICLK as the fourth clock transfer signal CTS<4> in synchronization with the edge of the fourth selected strobe signal SDQS<4> in response to the second mode signal MODE<5>. The fourth transfer signal generation circuit 770 may output the fourth selected strobe signal SDQS<4> as the fourth strobe transfer signal DTS<4> in synchronization with the edge of the internal clock ICLK in response to the second mode signal MODE<5>.

Figure 11:
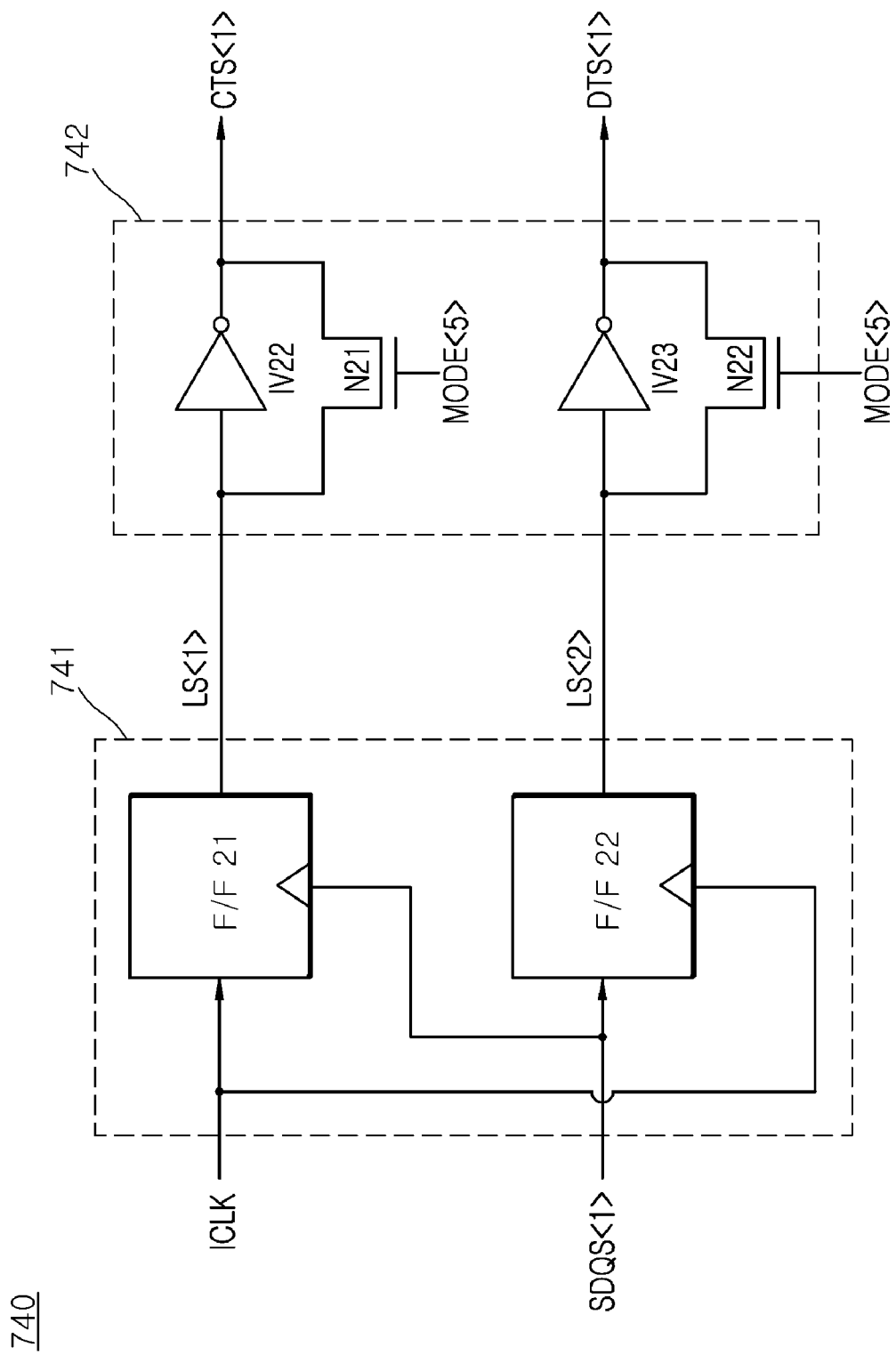
FIG. 11 is a circuit diagram illustrating a representation of an example of the configuration of the first transfer signal generation circuit included in the transfer signal generation circuit illustrated in FIG. 10.

Referring to FIG. 11, the first transfer signal generation circuit 740 may include a latch circuit 741 and a transfer circuit 742.

The latch circuit 741 may include flip-flops F/F21 and F/F22. The latch circuit 741 may latch the internal clock ICLK in synchronization with the rising edge of the first selected strobe signal SDQS<1> and thereby generate a first latch signal LS<1>. The latch circuit 741 may latch the first selected strobe signal SDQS<1> in synchronization with the rising edge of the internal clock ICLK and thereby generate a second latch signal LS<2>.

The transfer circuit 742 may include inverters IV22 and IV23 and NMOS transistors N21 and N22. The transfer circuit 742 may invert or non-invert the first latch signal LS<1> in response to the second mode signal MODE<5> and thereby output the first clock transfer signal CTS<1>. The transfer circuit 742 may invert the first latch signal LS<1> in the case where the second mode signal MODE<5> is a first logic level (i.e., a logic low level) and thereby output the first clock transfer signal CTS<1>. The transfer circuit 742 may non-invert the first latch signal LS<1> in the case where the second mode signal MODE<5> is a second logic level (i.e., a logic high level) and thereby output the first clock transfer signal CTS<1>. The transfer circuit 742 may invert or non-invert the second latch signal LS<2> in response to the second mode signal MODE<5> and thereby output the first strobe transfer signal DTS<1>. The transfer circuit 742 may invert the second latch signal LS<2> in the case where the second mode signal MODE<5> is the first logic level (the logic low level) and thereby output the first strobe transfer signal DTS<1>. The transfer circuit 742 may non-invert the second latch signal LS<2> in the case where the second mode signal MODE<5> is the second logic level (the logic high level) and thereby output the first strobe transfer signal DTS<1>.

Meanwhile, since each of the second transfer signal generation circuit 750, the third transfer signal generation circuit 760 and the fourth transfer signal generation circuit 770 is embodied by the same circuit and performs the same operation as the first transfer signal generation circuit 740 except that input and output signals are different, detailed descriptions thereof will be omitted herein.

Figure 12:
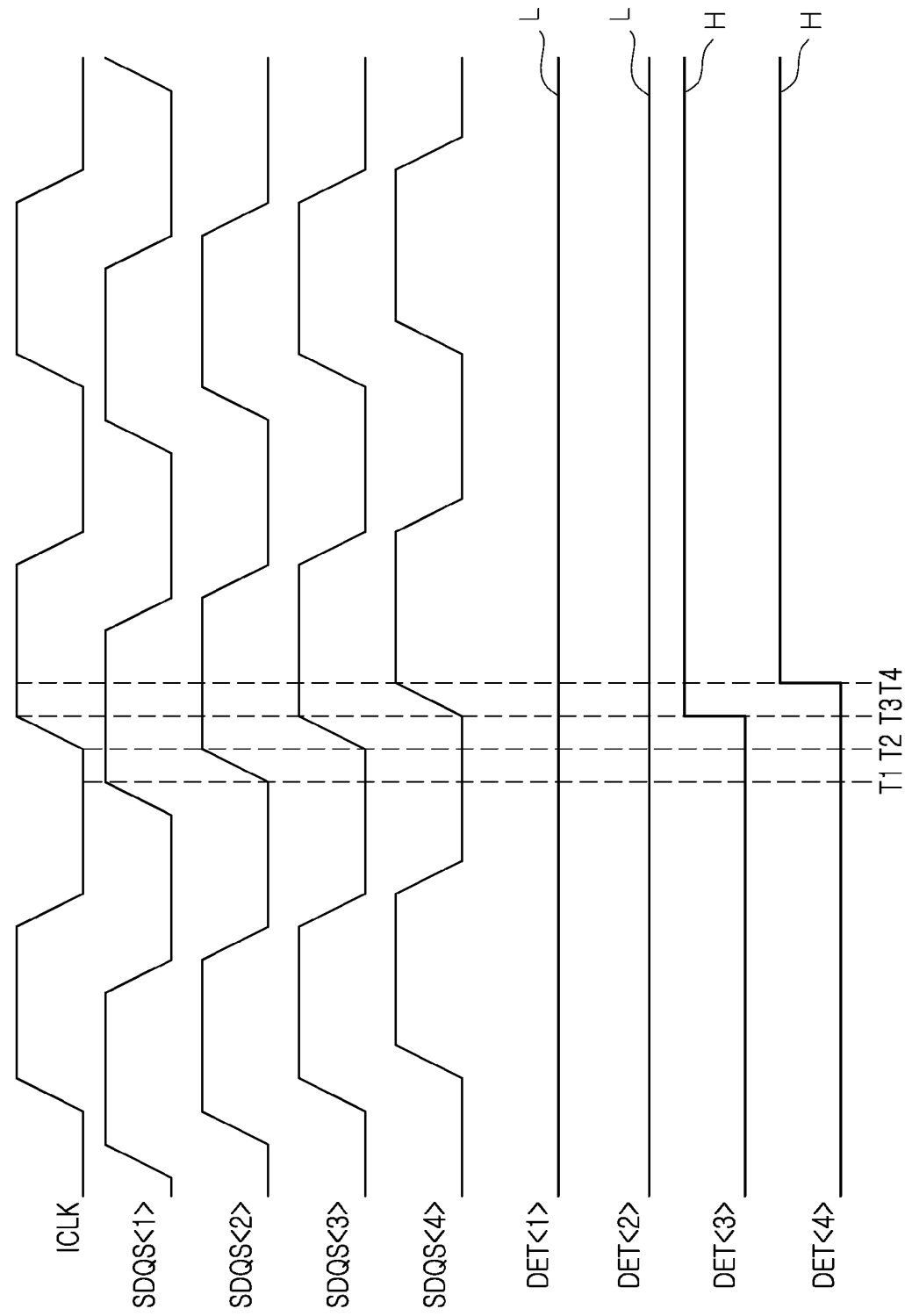
FIG. 12 is a representation of an example of a timing diagram to assist in the explanation of the operation of the semiconductor system in accordance with other embodiments.

An operation of generating the first to fourth detection signals DET<1:4> depending on the difference between the phase of the clock CLK and the phase of the strobe signal DQS will be described below as an example with reference to FIG. 12, by taking an example in which the first internal strobe signal IDQS0 is selected in the first mode, the first to fourth detection signals DET<1:4> are generated through non-inversion in the second mode and the first to fourth detection signals DET<1:4> are generated from the clock CLK in synchronization with the edge of the strobe signal DQS in the third mode.

In the case where the internal clock ICLK is a first logic level (i.e., a logic low level) at a time T1 corresponding to the rising edge of the first selected strobe signal SDQS<1>, the first detection signal DET<1> is generated at a first logic level (i.e., a logic low level).

In the case where the internal clock ICLK is the first logic level (the logic low level) at a time T2 corresponding to the rising edge of the second selected strobe signal SDQS<2>, the second detection signal DET<2> is generated at a first logic level (i.e., a logic low level).

In the case where the internal clock ICLK is a second logic level (i.e., a logic high level) at a time T3 corresponding to the rising edge of the third selected strobe signal SDQS<3>, the third detection signal DET<3> is generated at the second logic level (the logic high level).

In the case where the internal clock ICLK is the second logic level (the logic high level) at a time T4 corresponding to the rising edge of the fourth selected strobe signal SDQS<4>, the fourth detection signal DET<4> is generated at the second logic level (the logic high level).

In the case where the predetermined count of the second logic levels (the logic high levels) of the first to fourth detection signals DET<1:4> is set to 3, since the first and second detection signals DET<1:2> are generated at the first logic levels (the logic low levels) and the third and fourth detection signals DET<3:4> are generated at the second logic levels (the logic high levels), setting is made as a case where the phase of the strobe signal DQS is earlier than the phase of the clock CLK. Therefore, the first semiconductor device 3 adjusts the phase of the strobe signal DQS to be late.

As is apparent from the above descriptions, the semiconductor system in accordance with an embodiment may perform a write leveling operation by inverting or non-inverting a result of detecting the difference between the phase of a clock and the phase of a strobe signal. Also, the semiconductor system in accordance with an embodiment may perform the write leveling operation by setting the strobe signal or the clock as a reference for detecting the phase difference between the strobe signal and the clock.

Figure 13:
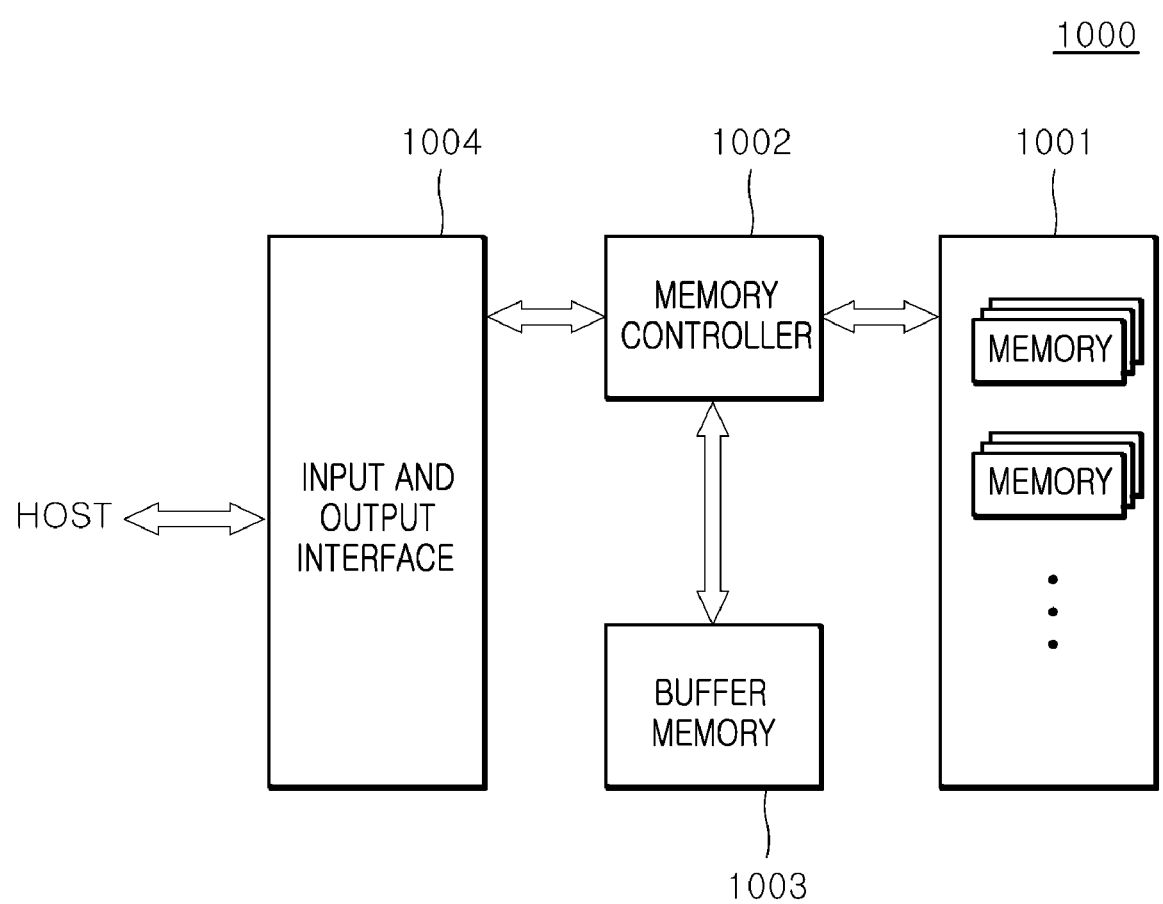
FIG. 13 is a diagram illustrating a representation of an example of the configuration of an electronic system to which the semiconductor systems illustrated in FIGS. 1 to 12 are applied.

The semiconductor system described above with reference to FIGS. 1 to 12 may be applied to an electronic system which includes a memory system, a graphic system, a computing system or a mobile system. For example, referring to FIG. 13, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the second semiconductor device 2 illustrated in FIG. 1 or the second semiconductor device 4 illustrated in FIG. 7. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 1 illustrated in FIG. 1 or the first semiconductor device 3 illustrated in FIG. 7. While the memory controller 1002 is illustrated as one block in FIG. 13, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor system described herein should not be limited based on the described embodiments.

What is claimed is:

1. A semiconductor system comprising:
a first semiconductor device configured to output a clock signal, a strobe signal and mode information signals, and detect a phase difference of the clock signal and the strobe signal depending on a detection signal; and
a second semiconductor device configured to detect a phase difference between a phase of the clock signal and a phase of the strobe signal to generate the detection signal,
wherein the second semiconductor device sets the strobe signal or the clock signal as a reference for detecting the phase difference between the phase of the clock signal and the phase of the strobe signal, and
wherein the second semiconductor device switches between the strobe signal and the clock signal as the reference depending on the mode information signals.

2. The semiconductor system according to claim 1, wherein the detection signal is generated from the strobe signal in synchronization with an edge of the clock signal or is generated from the clock signal in synchronization with an edge of the strobe signal, depending on the mode information signals.

3. The semiconductor system according to claim 1, wherein the first semiconductor device adjusts the phase difference of the clock signal and the strobe signal by detecting a logic level of the detection signal.

4. The semiconductor system according to claim 1, wherein when the detection signal has a first logic level, the detection signal is indicating the phase of the strobe signal is earlier than the phase of the clock signal, and when the detection signal has a second logic level, the detection signal is indicating the phase of the strobe signal is later than the phase of the clock signal.

5. The semiconductor system according to claim 1, wherein the second semiconductor device outputs the detection signal by inverting or non-inverting a logic level of the detection signal depending on the mode information signals.

6. The semiconductor system according to claim 1, wherein the second semiconductor device comprises:
a frequency dividing circuit configured to generate first to fourth internal strobe signals by dividing a frequency of the strobe signal;
a mode signal generation circuit configured to generate first to third mode signals by decoding the mode information signals; and
a phase difference detection circuit configured to generate the detection signal by comparing a phase of the clock signal and a phase of any one among the first to fourth internal strobe signals based on the first to third mode signals.

7. The semiconductor system according to claim 6, wherein the phase difference detection circuit comprises:
an input circuit configured to generate an internal clock signal by buffering the clock signal, and output any one among the first to fourth internal strobe signals as a selected strobe signal based on the first mode signal;
a transfer signal generation circuit configured to output the internal clock signal as a clock transfer signal in synchronization with an edge of the selected strobe signal and output the selected strobe signal as a strobe transfer signal in synchronization with an edge of the internal clock signal, based on the second mode signal; and
a detection signal generation circuit configured to output any one of the clock transfer signal and the strobe transfer signal as the detection signal based on the third mode signal.

8. The semiconductor system according to claim 7, wherein the input circuit comprises:
an internal clock generation circuit configured to generate the internal clock signal by comparing the clock signal and an inverted signal of the clock signal; and
a selective transfer circuit configured to output any one among the first to fourth internal strobe signals as the selected strobe signal based on the first mode signal.

9. The semiconductor system according to claim 7, wherein the transfer signal generation circuit comprises:
a latch circuit configured to generate a first latch signal by latching the internal clock signal in synchronization with the edge of the selected strobe signal, and generate a second latch signal by latching the selected strobe signal in synchronization with the edge of the internal clock signal; and
a transfer circuit configured to output the clock transfer signal by inverting or non-inverting the first latch signal and output the strobe transfer signal by inverting or non-inverting the second latch signal, based on the second mode signal.

10. A semiconductor system comprising:
a first semiconductor device configured to output a clock signal, a strobe signal and mode information signals, and detect a phase difference of the clock signal and the strobe signal depending on first to fourth detection signals; and
a second semiconductor device configured to set, based on the mode information signals, the strobe signal or the clock signal as a reference for detecting the phase difference of the clock signal and the strobe signal to generate the first to fourth detection signals.

11. The semiconductor system according to claim 10, wherein the first to fourth detection signals are generated from the strobe signal in synchronization with an edge of the clock signal or are generated from the clock signal in synchronization with an edge of the strobe signal, depending on the mode information signals.

12. The semiconductor system according to claim 10, wherein the first semiconductor device adjusts the phase difference of the clock signal and the strobe signal when a count of first logic levels of the first to fourth detection signals is different from a predetermined count.

13. The semiconductor system according to claim 10, wherein when the count of first logic levels of the first to fourth detection signals is less than the predetermined count, the detection signals are indicating the phase of the strobe signal is earlier than the phase of the clock signal, and when the count of first logic levels of the first to fourth detection signals exceed the predetermined count, the detection signals are indicating the phase of the strobe signal is later than the phase of the clock signal.

14. The semiconductor system according to claim 10, wherein the second semiconductor device outputs the first to fourth detection signals by inverting or non-inverting logic levels of the first to fourth detection signals depending on the mode information signals.

15. The semiconductor system according to claim 10, wherein the second semiconductor device comprises:
a frequency dividing circuit configured to generate first to fourth internal strobe signals by dividing a frequency of the strobe signal;

a mode signal generation circuit configured to generate first to third mode signals by decoding the mode information signals; and a phase difference detection circuit configured to generate the first to fourth detection signals by comparing a phase of the clock signal and a phase of any one among the first to fourth internal strobe signals based on the first to third mode signals.

16. The semiconductor system according to claim 15, wherein the phase difference detection circuit comprises:

an input circuit configured to generate an internal clock signal by buffering the clock signal, and generate first to fourth selected strobe signals by successively delaying any one among the first to fourth internal strobe signals based on the first mode signal;

a transfer signal generation circuit configured to output the internal clock signal as first to fourth clock transfer signals in synchronization with edges of the first to fourth selected strobe signals or output the first to fourth selected strobe signals as first to fourth strobe transfer signals in synchronization with an edge of the internal clock signal, based on the second mode signal; and a detection signal generation circuit configured to output the first to fourth clock transfer signals or the first to fourth strobe transfer signals as the first to fourth detection signals based on the third mode signal.

17. The semiconductor system according to claim 16, wherein the input circuit comprises:

an internal clock generation circuit configured to generate the internal clock signal by comparing the clock signal and an inverted signal of the clock signal;

a selective transfer circuit configured to output any one among the first to fourth internal strobe signals as a selection signal based on the first mode signal; and a delay circuit configured to generate the first to fourth selected strobe signals by successively delaying the selection signal.

18. The semiconductor system according to claim 16, wherein the transfer signal generation circuit comprises:

a first transfer signal generation circuit configured to output the internal clock signal as the first clock transfer signal in synchronization with the edge of the first selected strobe signal and output the first selected strobe signal as the first strobe transfer signal in synchronization with the edge of the internal clock signal, based on the second mode signal;

a second transfer signal generation circuit configured to output the internal clock signal as the second clock transfer signal in synchronization with the edge of the second selected strobe signal and output the second selected strobe signal as the second strobe transfer signal in synchronization with the edge of the internal clock signal, based on the second mode signal;

a third transfer signal generation circuit configured to output the internal clock signal as the third clock transfer signal in synchronization with the edge of the third selected strobe signal and output the third selected strobe signal as the third strobe transfer signal in synchronization with the edge of the internal clock signal, based on the second mode signal; and a fourth transfer signal generation circuit configured to output the internal clock signal as the fourth clock transfer signal in synchronization with the edge of the fourth selected strobe signal and output the fourth selected strobe signal as the fourth strobe transfer signal in synchronization with the edge of the internal clock signal, based on the second mode signal.

19. The semiconductor system according to claim 18, wherein the first transfer signal generation circuit comprises:

a first latch circuit configured to generate a first latch signal by latching the internal clock signal in synchronization with the edge of the first selected strobe signal, and generate a second latch signal by latching the first selected strobe signal in synchronization with the edge of the internal clock signal; and a first transfer circuit configured to output the first clock transfer signal by inverting or non-inverting the first latch signal and output the first strobe transfer signal by inverting or non-inverting the second latch signal, based on the second mode signal.

20. The semiconductor system according to claim 18, wherein the second transfer signal generation circuit comprises:

a second latch circuit configured to generate a third latch signal by latching the internal clock signal in synchronization with the edge of the second selected strobe signal, and generate a fourth latch signal by latching the second selected strobe signal in synchronization with the edge of the internal clock signal; and a second transfer circuit configured to output the second clock transfer signal by inverting or non-inverting the third latch signal and output the second strobe transfer signal by inverting or non-inverting the fourth latch signal, based on the second mode signal.

21. The semiconductor system according to claim 18, wherein the third transfer signal generation circuit comprises:

a third latch circuit configured to generate a fifth latch signal by latching the internal clock signal in synchronization with the edge of the third selected strobe signal, and generate a sixth latch signal by latching the third selected strobe signal in synchronization with the edge of the internal clock signal; and a third transfer circuit configured to output the third clock transfer signal by inverting or non-inverting the fifth latch signal and output the third strobe transfer signal by inverting or non-inverting the sixth latch signal, based on the second mode signal.

22. The semiconductor system according to claim 18, wherein the fourth transfer signal generation circuit comprises:

a fourth latch circuit configured to generate a seventh latch signal by latching the internal clock signal in synchronization with the edge of the fourth selected strobe signal, and generate an eighth latch signal by latching the fourth selected strobe signal in synchronization with the edge of the internal clock signal; and a fourth transfer circuit configured to output the fourth clock transfer signal by inverting or non-inverting the seventh latch signal and output the fourth strobe transfer signal by inverting or non-inverting the eighth latch signal, based on the second mode signal.

* * * * *